United States Patent [19]

Tsubota

[11] Patent Number: 5,067,809
[45] Date of Patent: Nov. 26, 1991

[54] OPTO-SEMICONDUCTOR DEVICE AND METHOD OF FABRICATION OF THE SAME

[75] Inventor: Takashi Tsubota, Tokyo, Japan

[73] Assignee: Oki Electric Industry Co., Ltd., Tokyo, Japan

[21] Appl. No.: 532,458

[22] Filed: Jun. 4, 1990

[30] Foreign Application Priority Data

Jun. 9, 1989 [JP] Japan .................................. 1-145209
May 8, 1990 [JP] Japan .................................. 2-116821

[51] Int. Cl.$^5$ .......................................... H01L 33/00
[52] U.S. Cl. ........................................ 357/17; 357/15; 357/16; 357/2; 357/4; 357/65; 357/67
[58] Field of Search ..................... 357/17, 15, 16, 65, 357/67, 2, 4

[56] References Cited

U.S. PATENT DOCUMENTS

| | | | |
|---|---|---|---|
| 3,790,867 | 2/1974 | Hayakawa | 357/17 X |
| 3,881,113 | 4/1975 | Rideout | . |
| 4,217,598 | 8/1980 | D'Auria et al. | 357/17 X |
| 4,495,514 | 1/1985 | Lawrence et al. | 357/4 X |
| 4,670,355 | 6/1987 | Matsudaira | 357/17 X |
| 4,680,602 | 7/1987 | Watanabe | . |
| 4,766,471 | 8/1988 | Ovshinsky | . |

FOREIGN PATENT DOCUMENTS 2334269  1/1977  France .
132177   7/1984  Japan .
311777  12/1987  Japan .
244689  10/1988  Japan .
1141098 11/1969  United Kingdom .

OTHER PUBLICATIONS

European Search Report, 11/28/90, Appl. No. EP 90 30 6150.
OKI Kenkyu Kaihatsu (OKI Research and Development) vol. 52, No. 1, "Development of Monolithic LED Array", by Takano, Jan., 1985.

Primary Examiner—Mark Hellner
Attorney, Agent, or Firm—Edward D. Manzo

[57] ABSTRACT

In an opto-semiconductor device, a light-emitting part formed on a substrate, a transparent insulating monocrystalline layer is formed over the entire surface of the substrate covering the light-emitting part, a contact window is opened through the transparent insulating monocrystalline layer in the center of the light-emitting part, and an electrode is formed of a transparent conductive monocrystalline layer passing through the contact window and connected to the central part of the light-emitting part, the electrode being formed on the transparent insulating monocrystalline layer. A transparent insulating monocrystalline layer may additionally be formed on the device including the electrode formed of the transparent conductive monocrystalline layer, and a photo-sensitive device formed of a monocrystalline layer may be provided on the transparent insulating monocrystalline layer.

8 Claims, 7 Drawing Sheets

OPTO-SEMICONDUCTOR DEVICE AND METHOD OF FABRICATION OF THE SAME

BACKGROUND OF THE INVENTION

The present invention relates to an opto-semiconductor device and a method of fabricating the same, and particularly to improvements in the interconnection for its light-emitting part.

As an example of conventional opto-semiconductor device, an LED (light-emitting diode) array shown in Oki Kenkyu Kaihatsu (Oki Technical Review) 52[1], pp. 31 to 32 is illustrated in FIG. 1A and FIG. 1B. The illustrated LED array is formed of an N-type GaAs substrate 1 (hereinafter referred to as a substrate) on which an N-type GaAsP (e.g., $GaAs_{0.6}P_{0.4}$ layer 2 is grown by VPE (vapor phase epitaxy), and then an insulating film such as $Al_2O_3$ film 3 is formed, and a window 4 of 70 $\mu m \times 110$ $\mu m$ is opened, and Zn is diffused through this window 4 to form a P-type GaAsP (e.g., $GaAs_{0.6}P_{0.4}$) layer 5 in the N-type GaAsP layer 2. Then, an $SiO_2$ film 6 is formed, as the second insulating film, over the entire surface to cover the window 4. An electrode contact window 7 (50 $\mu m \times 15$ $\mu m$) is then formed through the $SiO_2$ film 6 at one end in its longitudinal direction of said P-type GaAsP 5 (light-emitting part). An Al electrode 8 is then formed so that it is connected to the P-type GaAsP layer 5 at the part of the window 7. The reason why the contact for the Al electrode 8 with the P-type GaAsP layer 5 must be situated at an end of the P-type GaAsP 5 is that Al does not permit passage of light, so to minimize the obstruction to the passage of light, the contact should be situated at an end. After forming a PSG (phospho-silicate glass) film 9 as a passivation film over the entire surface, the PSG film 9 at the part for the wire bonding of the Al electrode 8 is removed. An AuGeNi electrode 10 is vapor-deposited, as a negative electrode, on the rear (obverse) surface of the substrate 1.

FIG. 2 shows a second example of conventional opto-semiconductor device. The fundamental structure of this second device is identical to the first example shown in FIG. 1. But the connection of the Al electrode 8 with the P-type GaAsP layer 5 is made around the light-emitting part (P-type GaAsP layer 5).

In the first example of the conventional opto-semiconductor device shown in FIG. 1, the contact between the P-type GaAsP layer 5 and the Al electrode 8 is positioned at one end of the P-type GaAsP layer 5, so the intensity of light emitted when the device is energized is decreased with the distance from the Al electrode 8 and the light intensity is not uniform throughout the light-emitting area. This is evidenced in the diagram No. 3 (the relationship between the distribution of light output within the light-emitting part and the depth of the PN junction) in the Oki Denki Kenkyu Kaihatsu, (this is shown in figure FIG. 3) showing the light intensity distribution along the longitudinal direction of the P-type GaAsP layer 5.

In the second example of the conventional opto-semiconductor device shown in FIG. 2, the effect of providing the contacting part of the Al electrode at one end of the light-emitting part is eliminated so the uniformity of the light intensity is improved, but as the Al electrode 8 spreads over a wide area, there is a problem of reflection of light at the electrode, and in addition the Al electrode 8 project from the side of the light-emitting part toward adjacent light-emitting part, so it is possible that short-circuiting between the electrodes of adjacent light emitting parts (in an array of light-emitting parts) may occur where the density of the P-type GaAsP layers 5 (light-emitting parts) is increased, i.e., the pitch of the light-emitting parts is reduced.

Furthermore, since both in the first and the second opto-semiconductor devices the Al does not permit passage of light so the light emission from the light-emitting part beneath the electrode is not fully utilized.

Moreover, because a metal is employed for the electrode, crystal cannot be grown on it, and it is difficult to form a three-dimensional device.

SUMMARY OF THE INVENTION

The present invention provides the problems of an opto-semiconductor device and a method of fabrication of the same which can solve the problems of light reflection, interelectrode short-circuiting in the case of a high density arrangement of the light-emitting parts, non-uniformity of the light intensity within the light-emitting area, incapacity of effective utilization of light emitted from the light-emitting part beneath the electrode, and difficulty in making a three-dimensional device.

To solve the above problems, in the present invention, a light-emitting part is formed on a substrate, a transparent insulating monocrystalline layer is formed over the entire surface of said substrate covering said light-emitting part, a contact window is opened through said transparent insulating monocrystalline layer in the center of said light-emitting part, and an electrode formed of a transparent conductive monocrystalline layer is formed on said transparent insulating monocrystalline layer to pass through said contact window and connected to the central part of said light-emitting part.

The device may further be provided with a transparent insulating monocrystalline layer is formed, and a photo-sensitive device of a monocrystalline layer formed on the transparent insulating monocrystalline layer.

In the present invention, the electrode is formed of a transparent conductive monocrystalline layer (transparent member), so there is no light reflection at the electrode, and the light from the light-emitting part beneath the electrode can be led outside.

Moreover, since the electrode is connected at the center of the light-emitting part, this being made possible because the electrode is transparent, the effect of providing the electrode contact at one end is eliminated, and the light intensity is uniform throughout the light-emitting area, and the electrode is not positioned between adjacent light-emitting parts, and the short-circuiting between the electrodes adjacent light-emitting parts is avoided even when the pitch of the light-emitting parts is reduced.

Furthermore, in this invention, the electrode is formed of a transparent conductive monocrystalline layer, so it can be used for passing a sufficient electric current through the electrode and hence the light-emitting part to cause light emission.

In addition, where the transparent conductive monocrystalline material is formed, the underlying layer must also be a monocrystalline layer, so in this invention, the insulating film covering the entire surface of the substrate is a transparent insulating monocrystalline layer, rather than an $SiO_2$ film as in the prior art.

The entire surface of the device of the invention having the transparent insulating monocrystalline layer and the transparent conductive monocrystalline electrode is formed of monocrystalline layers, so an insulating layer, an electrode and a semiconductor layer formed of monocrystalline layers may be stacked to form a three-dimensional device structure.

Moreover, where a transparent insulating monocrystalline layer is formed as an insulating layer covering the entire surface of the substrate, the surface being formed of the transparent insulating layer and the transparent conductive monocrystalline layer, by means of a photosensitive device formed on a transparent insulating monocrystalline layer which in turn is formed on such a surface, the light from the light-emitting region can be received through the transparent insulating monocrystalline layer. In this way, a light-emitting and photo-sensitive coupled device can be formed and hierarchy formation is enabled.

DETAILED DESCRIPTION OF THE PREFERRED EMBODIMENTS

First Embodiment

A first embodiment of the invention will now be described with reference to the drawings.

Figure 1A:
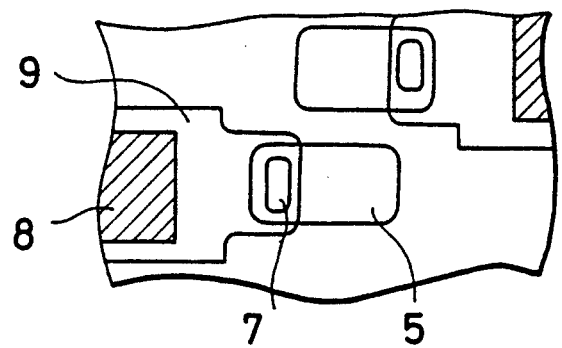
FIG. 1A is a plan showing a first example of conventional opto-semiconductor device.
Figure 1B:
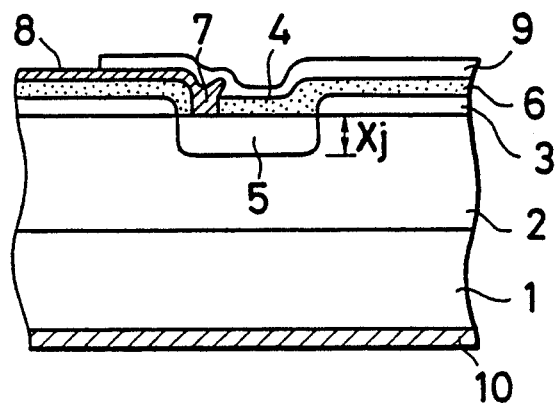
FIG. 1B is a cross sectional view of FIG. 1A.
Figure 2:
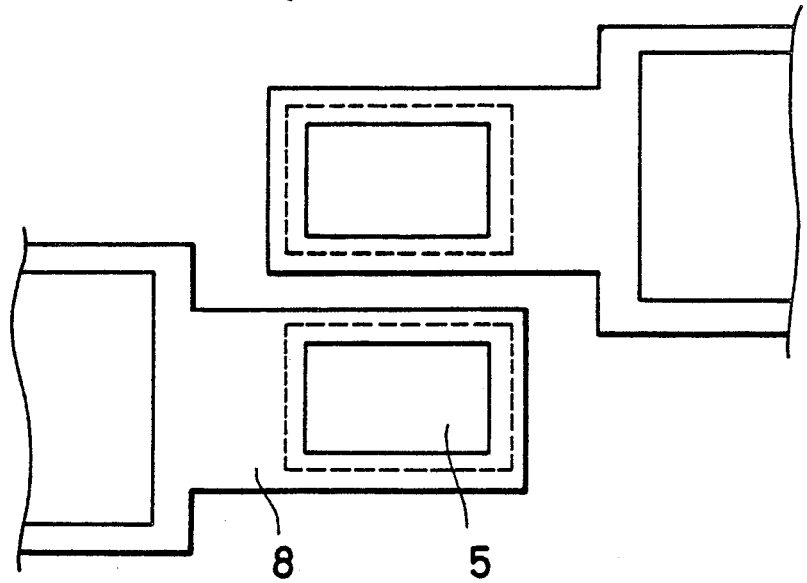
FIG. 2 is a plan view of a second example of conventional device.
Figure 3:
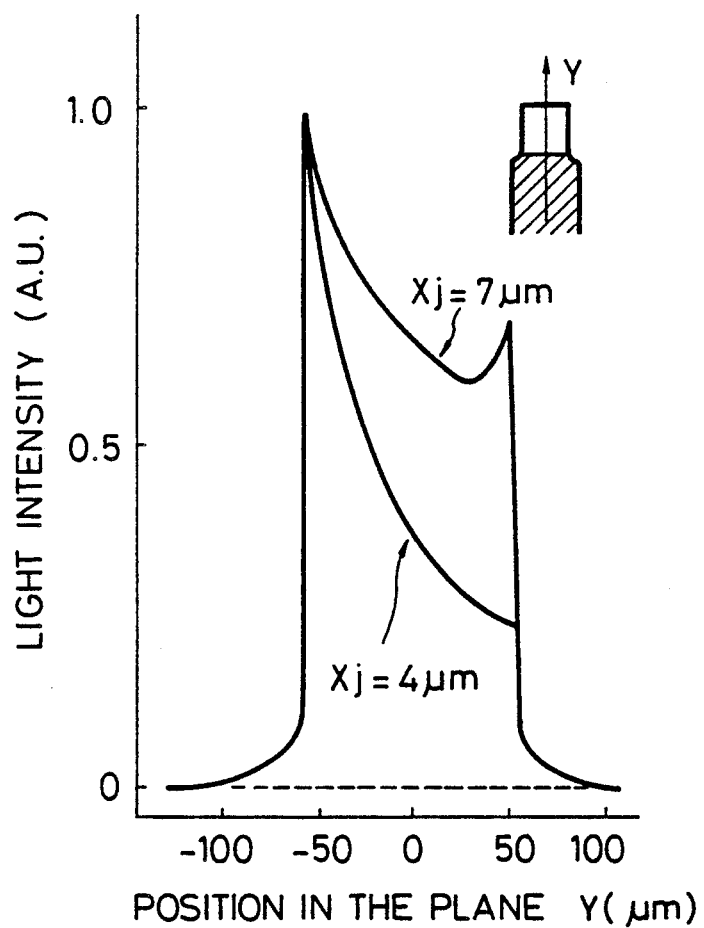
FIG. 3 is a characteristic diagram showing the relationship between the light output distribution within the light-emitting part of the opto-semiconductor device and the PN junction depth.
Figure 4A:
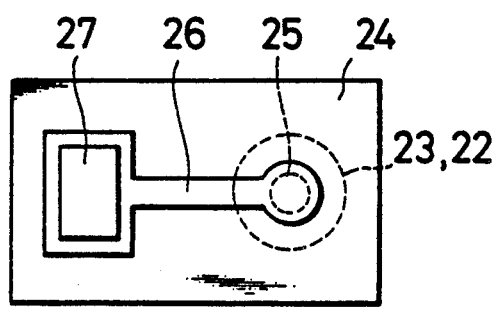
FIG. 4A and FIG. 4B shows a plan view and a cross sectional view of an embodiment of the opto-semiconductor device of this invention.
Figure 4B:
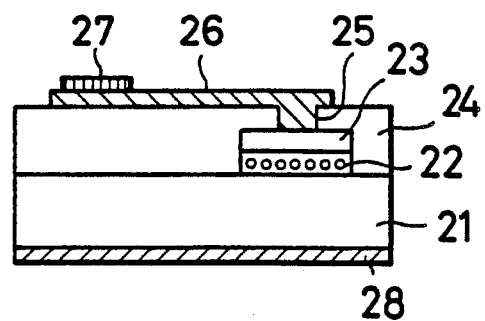

FIG. 4A and FIG. 4B show an embodiment of the opto-semiconductor device of this invention. FIG. 4A is a plan view, and FIG. 4B is a cross sectional view. In these figures, 21 denotes a monocrystalline P-type InP substrate. Formed on this substrate 21 at a predetermined location, being stacked, are a non-dope InGaAsP active layer 22 as a light-emitting part, and an N-type InP layer 23 for improving the light-emission efficiency. Formed over the entire surface of the substrate 21 to cover these active layer 22 and the N-type InP layer 23 is an Fe-doped insulating InP layer 24 as a transparent insulating monocrystalline layer. A contact window 25 is formed through the insulating InP layer 24 at the central part of the active layer 22. An electrode 26 formed of an N-type InGaAsP layer (transparent conductive monocrystalline layer) is formed over the insulating InP layer 24 to extend through this contact window 25 and to be connected to the central part of the N-type InP layer 23 and hence the central part of the active layer 22. An AuGeNi electrode 27 is formed, being stacked, on the bonding pad part of this electrode 26. An AuZn electrode 28 is formed on the rear surface of the substrate 21.

The opto-semiconductor device is fabricated in a manner shown in FIG. 5A to FIG. 5F (which is an embodiment of the method of fabrication of this embodiment.)

Figure 5A:
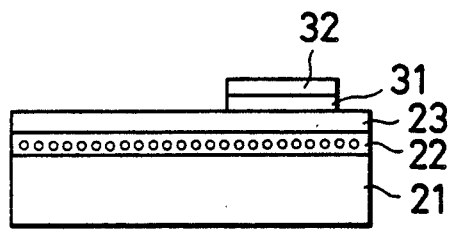
FIG. 5A to FIG. 5F show process step cross sectional views of an embodiment of the method of fabrication of the opto-semiconductor device of this invention.

First, as shown in FIG. 5A, a non-dope InGaAsP active layer 22 ($\lambda_g = 1.3$ $\mu$m, about 1 $\mu$m), and an N-type InP layer 23 (Sn-doped, about 1 $\mu$m) are successively grown on a monocrystalline P-type InP substrate 21. Because the underlying layer is a monocrystalline layer, the layers 22 and 23 are grown as monocrystalline layers. An SiO$_2$ film 31 (about 2000 angstroms thick) is formed by chemical vapor deposition on the N-type InP layer 23, and then a photo-resist pattern 32 is formed on it. Using the photo-resist pattern 32 as a mask, the SiO$_2$ film 31 is etched by an HF (hydrofluoric acid)-based etchant, to leave the SiO$_2$ film 31 only at the area where a light-emitting part will be formed.

Figure 5D:
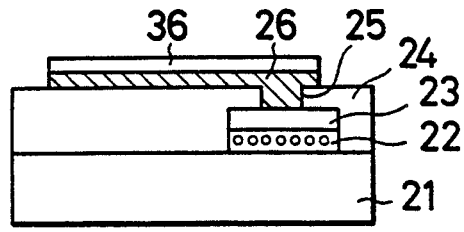
Figure 5B:
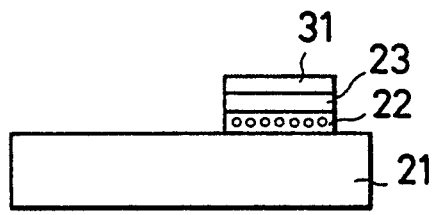

After the photo-resist pattern 32 is removed, the N-type InP layer 23 and the active layer 22 are etched, using the SiO$_2$ film 31 as a mask, by means of a Br-type etchant, to leave these layers only at the area where the light-emitting part will be formed, as shown in FIG. 5B.

Then, using the SiO$_2$ film 31 as a mask for the selective growth, an Fe-doped insulating InP layer 24 is grown on the substrate 21 by MOCVD (metal organic chemical vapor deposition) to the same height as the N-type InP layer 23. Then, the SiO$_2$ film 31 is removed, and an Fe-doped insulating InP layer 24 is again grown over the entire surface of the substrate 21 to a thickness of about 1 $\mu$m by means of MOCVD. The result is that the insulating InP layer 24 is formed over the entire surface of the substrate 21 to cover the remaining N-type InP layer 23 and active layer 22, as shown in FIG. 5C. Because the underlying layers are monocrystalline, the insulating InP layer 24 is grown as a monocrystalline layer. Then, an SiO$_2$ film 33 (about 2000 angstroms thick) is formed by PCVD (plasma-assisted chemical vapor deposition) on the insulating InP layer 24 (transparent insulating monocrystalline layer), and then a photo-resist pattern 34 is formed on it. Then, using the photo-resist pattern 34 as a mask, the SiO$_2$ film 33 is etched by means of an HF-based etchant, to form opening 35 through the SiO$_2$ film 33 at the central part of the remaining active layer 22 (light-emitting part).

Then, the photo-resist pattern 34 is removed, and using the SiO$_2$ film as a mask, the insulating InP layer 24 is etched by means of a Br-type etchant through the opening 35 formed in the SiO$_2$ film 33, to open a contact window 25 through the insulating InP layer 24 at the central part of the remaining active layer 22.

Then, the SiO$_2$ film 33 is removed by an HF-based etchant, and an N-type InGaAs P layer ($\lambda_g = 1.2$ $\mu$m and the thickness = 0.5 $\mu$m) as an electrode is formed by liquid phase epitaxy over the entire surface of the insulating InP layer 24. Since the underlying layer is monocrystalline, the N-type InGaAsP layer is grown as a monocrystalline layer. At the part of the contact window 25, it fills the contact window 25 and is connected to the N-type InP layer 23 as it is grown. Then, a photo-resist pattern 36 is formed on the the N-type InGaAsP layer and using the photo-resist layer 36 as a mask, the N-type InGaAsP layer (transparent conductive monocrystalline layer) is etched, as shown in FIG. 5D. Thus, an electrode 26 formed of the remaining N-type InGaAsP layer passing through the contact window 25 and connected to the central part of the N-type InP layer 23 and hence the central part of the active layer 22 is formed.

Figure 5E:
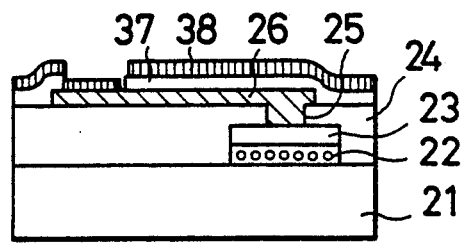
Figure 5C:
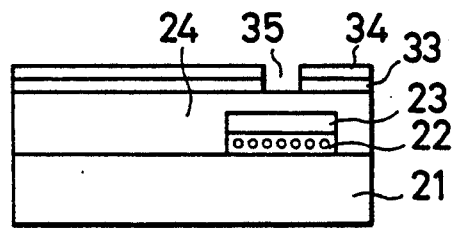
Figure 5F:
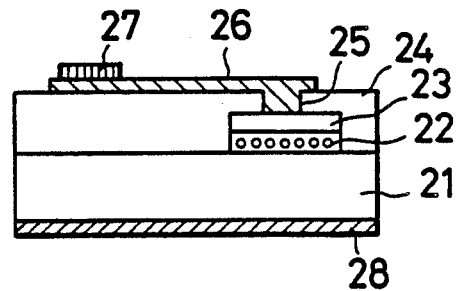

Then, the photo-resist pattern 36 is removed, and another photo-resist pattern 37 is formed as shown in FIG. 5E, and an AuGeNi metal 38 is vapor-deposited, and unnecessary AuGeNi metal 38 is removed by means of lift-off, and the AuGeNi metal 38 at the bonding pad part of the electrode 26 is left as an AuGeNi electrode 27 as shown in FIG. 5F. Then, as is also shown in FIG. 5F, an AuZn electrode 28 is formed on the rear surface of the substrate 21. This completes the fabrication of the opto-semiconductor device of FIG. 4.

As has been described in detail, according to the embodiment described above, the electrode is formed of a transparent conductive monocrystalline layer, so the problem of light reflection at the electrode is solved, and the light emitted at the light-emitting part beneath the electrode is effectively led outside. In addition, the electrode can be connected at the central part of the light-emitting part, so the effect of providing the electrode contact part at one end is eliminated and the light intensity within the light-emitting area is made uniform, and in addition the light-emitting part the electrode does not project from the side of the light-transmitting part toward adjacent light-transmitting part, so short-circuiting between electrodes can be avoided even when the pitch of the light-emitting parts is decreased.

Moreover, according to the invention, the electrode is formed of a transparent conductive monocrystalline layer, a sufficient electric current can be passed trough the electrode and hence through the PN junction of the light-emitting part to cause light emission. Although an indiumtitanium oxide film is also a transparent electrode material, it does not permit passage of a sufficient electric current (although it permits application of a sufficient voltage), so it cannot be employed in an opto-semiconductor device.

Furthermore, a transparent insulating monocrystalline layer is formed as an underlying insulating film for the formation of the transparent conductive monocrystalline layer, so the entire surface of the device is monocrystalline, and an insulating layer, an electrode and a semiconductor layer formed of monocrystalline layers may be stacked on it to form a device of the three-dimensional structure.

Second Embodiment

Figure 6A:
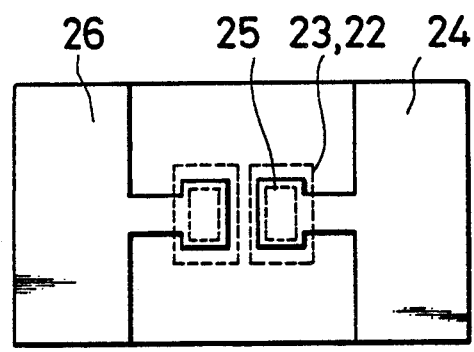
FIG. 6A shows a plan view of an embodiment of the opto-semiconductor device of this invention.
Figure 6B:
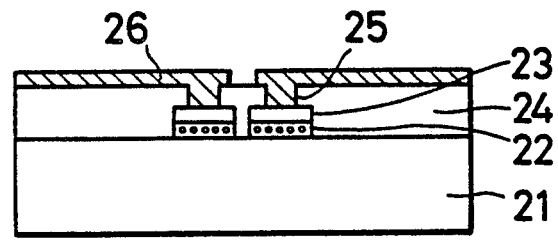
FIG. 6B is a cross sectional view of FIG. 6A.
Figure 6C:
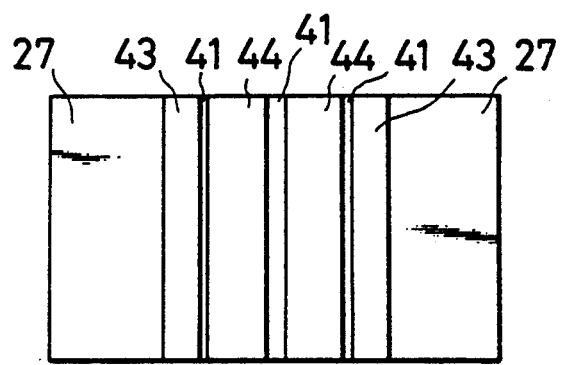
FIG. 6C is a plan view of the above embodiment after the formation of a three dimensional device.
Figure 6D:
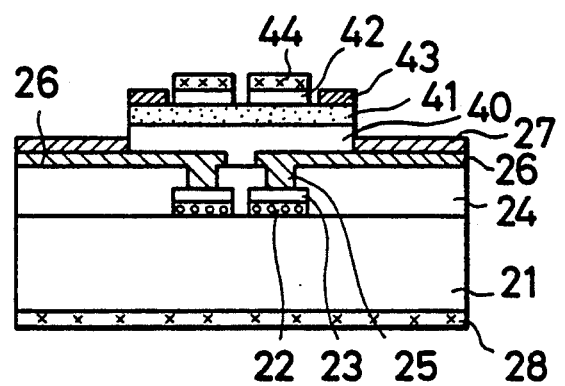
FIG. 6D is a cross sectional view of FIG. 6C.

Another embodiment of the invention will now be described with reference to the drawings. FIG. 6A to FIG. 6D show an opto-semiconductor device of an embodiment of this invention. FIG. 6A is a plan view of a state in which the light-emitting part alone is formed, FIG. 6B is a cross sectional view of the same state, FIG. 6C is a plan view of a state in which a three-dimensional device has been formed, and FIG. 6D is a cross sectional view of the same state. In these figures, the reference numerals identical to those in FIG. 4A and FIG. 4B, and FIG. 5A to FIG. 5F denote identical or similar components or members.

In these FIG. 6A to FIG. 6D, 21 denotes a monocrystalline P-type InP substrate (hereinafter referred to as a substrate), and formed on this substrate 21 at a predetermined location, being stacked, are a non-dope InGaAsP active layer 22 as a light-emitting part (an active layer), and an N-type InP layer 23 for improving the light-emission efficiency.

Formed over the entire surface of the substrate 21 to cover these active layer 22 and the N-type InP layer 23 is an Fe-doped insulating InP layer 24 (an insulating InP layer) as a transparent insulating monocrystalline layer. A contact window 25 is formed through the insulating InP layer 24 at the central part of the active layer 22. An electrode 26 formed of N-type InGaAsP layer (transparent conductive monocrystalline layer) as a transparent electrode is formed over the insulating InP layer 24 to extend through this contact window 25 and to be connected to the central part of the N-type InP layer 23 and hence the central part of the active layer 22. A AuGeNi electrode 27 is formed, being stacked, on the bonding pad part of this electrode 26.

In addition, an AuZn electrode 28 is formed on the rear surface of the substrate 21.

The structure described so far is identical to that of the embodiment of FIG. 4A and FIG. 4B.

Additional components in the embodiment of FIG. 6A to FIG. 6D are shown in FIG. 6C and FIG. 6D. These additional components comprise a transparent insulating InP layer 40 that is partially formed on the electrode 26.

An N-type InGaAs layer 41 and a P-type InGaAs layer 42 are successively formed on the insulating InP layer 40. This P-type InGaAs layer 42 is split into two parts.

An AuZn electrode 44 is formed on this split P-type InGaAs layer 42, and an AuGeNi electrode 43 is formed on the N-type InGaAs layer 41.

The opto-semiconductor device of the above configuration is fabricated by a method of fabrication shown in FIG. 7A to FIG. 7I.

The method of fabrication of an opto-semiconductor device of this invention will now be described with reference of the process step cross sectional view of FIG. 7A to FIG. 7I.

The process steps shown in FIG. 7A to FIG. 7D are identical to those shown in and described with reference to FIG. 4A to FIG. 4D, except that the drawings show the area for two light-emitting parts. Description of the process stesp shown in FIG. 7A to FIG. 7D is therefore omitted.

The difference of this embodiment from the first embodiment resides in the process steps shown in FIG. 7E to FIG. 7I. That is, after the photo-resist pattern 36 is removed, to result in the structure shown in FIG. 7E, an $SiO_2$ film 45 is formed by means of chemical vapor deposition over the entire surface, and the $SiO_2$ film 45 except the bonding pad part for the electrode 26 is removed by photo-lithography.

Then, a transparent insulating layer 40 (about 1 μm), an N-type InGaAs layer 41 ($\lambda_g$=1.6 μm, about 1 μm), and a P-type InGaAs layer 42 ($\lambda_g$=1.6 μm, about 1 μm) are successively formed by means of liquid phase epitaxy.

Figure 7A:
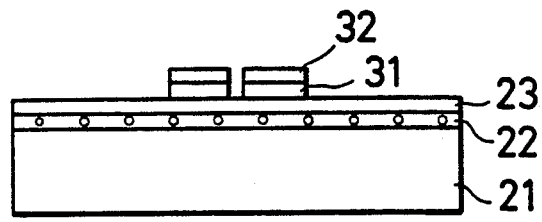
FIG. 7A to FIG. 7I are process step cross sectional views of an embodiment of the method of fabrication of the opto-semiconductor device of this invention.
Figure 7B:
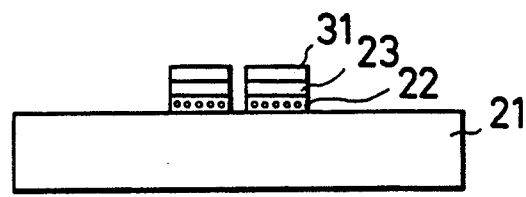
Figure 7C:
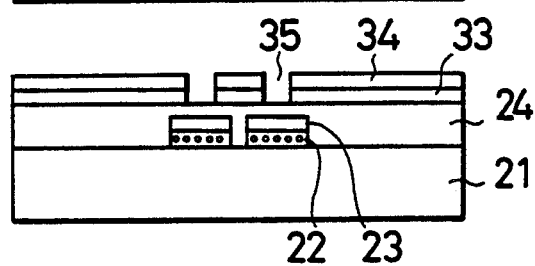
Figure 7D:
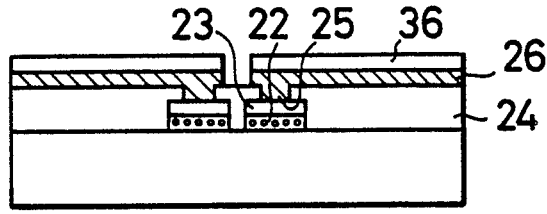
Figure 7E:
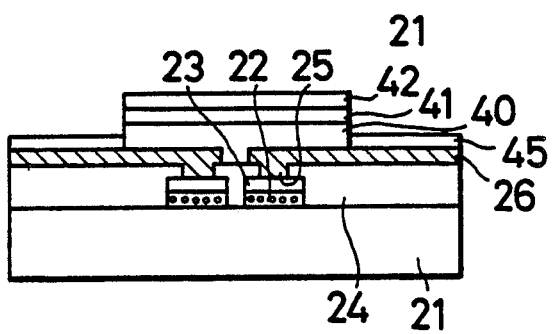
Figure 7F:
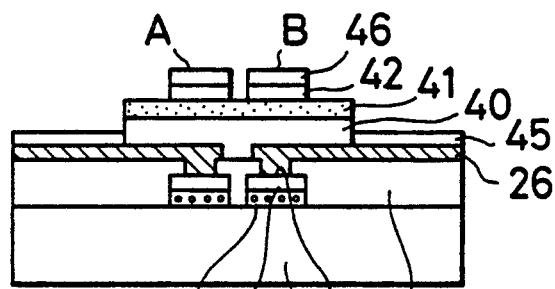

Then, as shown in FIG. 7F, an SiN film 46 is formed by means of chemical vapor deposition, and the SiN film 46 is subjected to photo-lithography to be left only at two regions A and B (where the light-receiving parts will be formed), and, using this SiN film 46 as a mask, the P-type InGaAs layer 42 is etched by means a mixture of nitric acid and hydrofluoric acid (HF) and water.

Figure 7G:
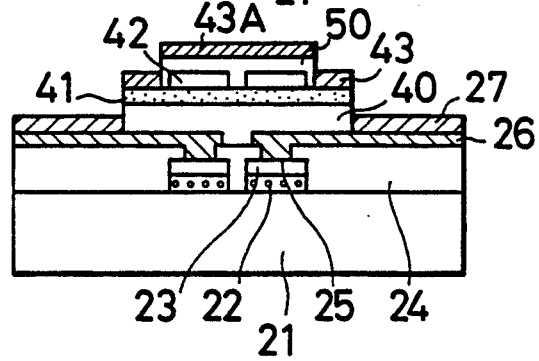

Then, as shown in FIG. 7G, the SiO$_2$ film 45 at the bonding pad part of the electrode 26 is removed by means of hydrofluoric acid.

Because of the difference in the etching rate, the SiN film 46 is left. Then, a photo-resist 50 is coated, and is subsequently subjected to potolithography to be left to cover the regions A and B.

Then, an AuGeNi electrode is formed, by means of vapor deposition. The part on the electrode 26 will become an AuGeNi electrode 27, while the part on the N-type InGaAs layer 41 will become an AuGeNi electrode 43. Although, a AuGeNi layer 43 is also formed over the photo-resist pattern 50, it will be removed when the photo-resist pattern 50 is later removed.

Figure 7H:
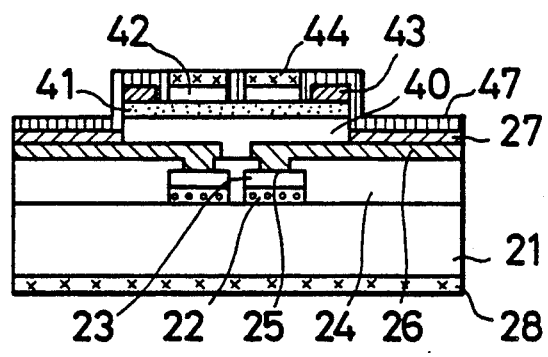

Then, as shown in FIG. 7H, the photo-resist 50 and the SiN film 46 are removed, and another photo-resist 47 is coated, and a window is formed only over the P-type InGaAs layer 42.

Figure 7I:
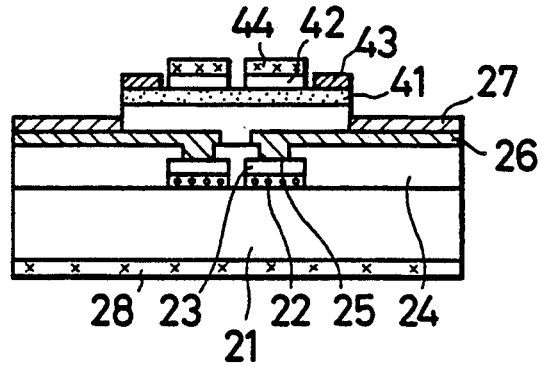

Then, an AuZn electrode 44 is vapor-deposited on the P-type InGaAs layer 42, and the photo-resist 47 is removed. Finally, an AuZn electrode 28 is formed on the rear surface of the substrate 21. As a result, an opto-semiconductor device as shown in FIG. 7I is obtained.

In addition to the advantages described with reference to the first embodiment, the second embodiment has the following additional advantage:

That is, a photo-sensitive device of a monocrystalline structure with an intervening transparent insulating monocrystalline layer is formed, and a three-dimensional device is thus formed, and by reverse-biasing the P-type InGaAs layer with a negative potential and the N-type InGaAs layer with a positive potential, it is possible to respond to the light from the light-emitting part beneath it.

What is claimed is:

1. An opto-semiconductor device comprising:
   (a) a substrate and a light-emitting part located thereon;
   (b) a transparent insulating monocrystalline layer located over said substrate and said light-emitting part;
   (c) a contact window opened through said transparent insulating monocrystalline layer, said window being located over a portion of said light-emitting part; and
   (d) an electrode comprising a transparent conductive monocrystalline layer passing through said contact window and coupled to the portion of said light-emitting part, at least a section of said electrode being located on said transparent insulating monocrystalline layer.

2. An opto-semiconductor device comprising:
   (a) a light-emitting part formed on a substrate;
   (b) a transparent insulating monocrystalline layer formed over a portion of said substrate covering said light-emitting part;
   (c) a contact window opened through said transparent insulating monocrystalline layer in a portion of said light-emitting part;
   (d) an electrode formed of a transparent conductive monocrystalline layer passing through said contact window and connected to the portion of said light-emitting part, said electrode being formed on said transparent insulating monocrystalline layer;
   (e) a transparent insulating monocrystalline layer formed on the device including the electrode formed of said transparent conductive monocrystalline layer; and
   (f) a photo-sensitive device formed of a monocrystalline layer provided on said transparent insulating monocrystalline layer.

3. A method of fabricating an opto-semiconductor device comprising the steps of:
   (a) forming a light-emitting part on a substrate;
   (b) forming a transparent insulating monocrystalline layer over a portion of the surface of said substrate to cover said light-emitting part;
   (c) forming a contact window through said transparent insulating monocrystalline layer in a portion of said light-emitting part; and
   (d) forming an electrode of a transparent conductive monocrystalline layer passing through said contact window and connected to the portion of said light-emitting part, on said transparent insulating monocrystalline layer.

4. A method comprising the steps of:
   (a) forming a light-emitting part on a substrate;
   (b) forming a transparent insulating monocrystalline layer over a portion of said substrate to cover said light-emitting part;
   (c) forming a contact window through said transparent insulating monocrystalline layer in a portion of said light-emitting part;
   (d) forming an electrode of a transparent conductive monocrystalline layer passing through said contact window and connected to the portion of said light-emitting part, on said transparent insulating monocrystalline layer;
   (e) forming an insulating monocrystalline layer on the device including the electrode formed of said transparent conductive monocrystalline layer; and
   (f) providing a photo-sensitive device formed of a monocrystalline layer on said transparent insulating monocrystalline layer.

5. An opto-semiconductor device according to claim 1 wherein said transparent conductive monocrystalline layer is formed of a semiconductor.

6. An opto-semiconductor device according to claim 5 wherein said transparent insulating monocrystalline layer is formed of a semiconductor.

7. A method according to claim 3 wherein said transparent conductive monocrystalline layer is formed of a semiconductor.

8. A method according to claim 3 wherein said transparent insulating monocrystalline layer is formed of a semiconductor.

* * * * *